(12) United States Patent
Tao

(10) Patent No.: US 7,190,112 B2
(45) Date of Patent: Mar. 13, 2007

(54) PHOTORESIST MASK/SMOOTHING LAYER ENSURING THE FIELD HOMOGENEITY AND BETTER STEP-COVERAGE IN OLED DISPLAYS

(75) Inventor: Ye Tao, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 11/424,574

(22) Filed: Jun. 16, 2006

(65) Prior Publication Data

US 2006/0220545 A1 Oct. 5, 2006

Related U.S. Application Data

(62) Division of application No. 10/638,493, filed on Aug. 11, 2003, now Pat. No. 7,086,917.

(60) Provisional application No. 60/402,540, filed on Aug. 12, 2002.

(51) Int. Cl.
*H05B 33/00* (2006.01)

(52) U.S. Cl. .................................... 313/504; 313/506

(58) Field of Classification Search ......... 313/498–512
See application file for complete search history.

(56) References Cited

U.S. PATENT DOCUMENTS

| 5,488,497 A | * | 1/1996 | Takanashi et al. | 349/122 |
| 5,937,272 A | * | 8/1999 | Tang | 438/30 |
| 6,069,443 A | * | 5/2000 | Jones et al. | 313/504 |
| 6,995,035 B2 | * | 2/2006 | Cok et al. | 438/82 |

* cited by examiner

*Primary Examiner*—Joseph Williams
(74) *Attorney, Agent, or Firm*—Marks & Clerk; Richard J. Mitchell

(57) ABSTRACT

A method of making an organic light emitting device (OLED) is disclosed wherein an inert insulating conformal smoothing layer is deposited over a protruding structure. The smoothing layer is patterned to expose portions of the structure underlying the smoothing layer and defining active regions of the device. The inert smoothing layer is treated, preferably by heat reflow, to taper the layer over the stepped edges of the structure on the exposed portions. Additional layers are then deposited over the smoothing layer and the exposed portions of the structure. The smoothing layer blunts all underlying layer edges and provides sloped edges wherever a step occurs from one layer to another. This effect results in a homogeneous field across the pixel and the continuity in the layers deposited after the photoresist layer.

9 Claims, 3 Drawing Sheets

Light emission

PHOTORESIST MASK/SMOOTHING LAYER ENSURING THE FIELD HOMOGENEITY AND BETTER STEP-COVERAGE IN OLED DISPLAYS

CROSS REFERENCE TO RELATED APPLICATION

This application is a divisional application of U.S. application Ser. No. 10/638,493 file Aug. 11, 2003 now U.S. Pat. No. 7,086,917 and claims the benefit under 35 USC 119(e) of prior provisional application Ser. No. 60/402,540 filed Aug. 12, 2002.

FIELD OF INVENTION

The invention relates to the field of optical devices, and in particular to organic light emitting devices (OLEDs), and to a method of manufacturing such devices.

BACKGROUND OF INVENTION

OLEDs have recently shown promise for use as a light source in optical displays. A typical structure for an OLED is shown in FIG. 1 and consists of a stack of organic semiconductor layers 10 between a transparent electrode 12 (usually an indium tin oxide (ITO) layer acting as an anode) on a glass substrate 14 and another electrode 16 (usually a layer of low work function metal, metal alloy or cermet material acting as a cathode). At positive bias, electric current will flow through the device and light emission will occur between the overlapped area of anode and cathode.

In order to display information, it is necessary to make pixels of the required shape. This can be achieved either by patterning the first electrode (anode) or using shadow masks to define the shape of the second electrode, or patterning both electrodes depending on the application.

The vertical dimension of organic light emitting devices (OLED) is usually very thin. To optimize the hole-transport, electron-transport properties and device efficiency, the total thickness of the organic layer between the cathode and anode is typically between 100 nm and 200 nm. A typical OLED has an electric field of ~$10^6$V/cm during device operation. This high electric field makes OLEDs very sensitive to the edges of patterned ITO substrates (the first electrode) or other types of electrode on which the organic materials is deposited. Imperfect step coverage of the deposited organic materials will result in a substantially higher electric field and higher local current density at that area. This will cause the device to break down.

FIG. 2 shows an anode 12 that has been patterned for form three OLED devices 20a, 20b, 20c. The lack of anode material between the devices causes a step between the portions of the deposited cathode layer 16a and organic layer 10a located between the OLED devices and between the portions of the same layers, 16b, 10b over the OLED devices. FIG. 2 shows that in some cases the patterned ITO layer 12 or other type of electrode layer is thicker than the organic layer 10. Since thermal vacuum deposition, which is used to deposit the organic layer 12, is generally non-conformal, some uncovered ITO anode area 21 will come into contact with the metal cathode layer 16 deposited after the deposition of the organic layers 12. This will cause massive short circuits in the devices.

Because of the non-conformal nature of the thermal deposition, when the total thickness of ITO anode and organic layers exceeds the thickness of the cathode layer, a discontinuity 22 may occur in cathode layer where it passes from the OLED to the area between the OLEDs. This type of discontinuity will cause device failure in OLEDs based on a common cathode (or common anode) design and may also cause device failure in individual pixels or segments due to the open circuit between the electrode layer and connection pads.

Deposited silicon oxide, aluminum oxide, or silicon nitride is typically used to define an emissive area. After the deposition of insulating material, a photolithographic process and an etching process are necessary to create pixel areas and sloped edges. Such a process is described in U.S. Pat. No. 6,069,443, the contents of which are herein incorporated by reference. This process is complicated. It involves dielectric deposition, a photolithographic process, and at least one etching step for creating pixel areas. The deposition of dielectric material is also expensive.

Various solutions have been proposed in the prior art, all of which are unsatisfactory for one reason or another. Mathine et al (U of Arizona) [D. L. Mathine et al, Appl. Phys. Lett., 76(26), 2000, p 3849], describes the use of PEDOT:PSS (poly(ethylened ioxythiophene) doped with polystyrenesulfonate) as a buffer layer between a CMOS active matrix and the OLED. It is spun-5 on and forms a 20 nm thick conformal layer that covers the dielectric edges between pixels. It is resistive enough not to short the different pixels, and helps charge injection into the hole transport layer. A lift-off photoresist pattern is applied prior to PEDOT/PSS so that layer can be lifted off the connection pads. The layer is too thin to smooth out underlying structures and is actually part of the diode.

Shimoda (Seiko, CDT) [Asia Display 98, p 2171 use an $SiO_2$ "adhesive" layer and a polyimide "interval layer" between a TFT active matrix and the PLEDs. Both have openings that define the pixels. Shimoda's layer is an insulating and passivation layer. The edges are not sloped.

Steward et al (U of Lehigh and Emagin, old FED Corp) [IEDM 98, p 871] use two spin-on-glass layers for planarization of a TFT matrix. The first layer goes below the ITO anode to ensure planarity of the ITO electrode on top of the matrix, and the second layer defines pixel openings and smoothes the matrix. The SOG layers are spun, cured at 300° C., patterned and wet-etched in a certain way so that the organic materials have good step coverage.

Jones (Emagin, old FED Corp) [U.S. Pat. No 6,069,443] describes the use of a separator for passive matrix displays with an overhanging profile and an underlying insulator that prevents short-circuits from happening when the cathode flows on top of the organics edge defined by the overhanging separator. Jones employs an underlying insulator with openings that substantially define pixels, and with tapered edges to minimize edge shorts. The purpose of Jones' structure is to prevent short-circuits.

Smoothing layers have been used in LCDs between the color filters, patterned first on the substrate, and the ITO electrode (see for example U.S. Pat. No. 5,488,497). In this case the goal is to ensure color purity and has nothing to do with field homogeneity since liquid crystal layers are very thick compared to the thickness of the electrodes.

SUMMARY OF THE INVENTION

In one embodiment the invention provides a photoresist-based smoothing mask technique to overcome the difficulties encountered in the prior art in the fabrication of OLEDs.

The use of a photoresist as a smoothing layer permits direct patterning of the OLEDs and simplified sloping by temperature reflow.

According to the present invention there is provided a method of making an organic light emitting device (OLED) comprising forming a structure with stepped edges; depositing a conformal smoothing layer over said structure, said smoothing layer having a thickness greater than said structure; patterning said smoothing layer to expose portions of said structure underlying said smoothing layer and defining active regions of said device; treating said smoothing layer to taper said smoothing layer over said stepped edges of said structure on said exposed portions; and depositing additional layers over said smoothing layer and said exposed portions of said structure.

In accordance with the principles of the invention the applied smoothing layer has openings to define the pixels and blunts all underlying layer edges in order to ensure that the thickness of organic layers is as constant as possible everywhere they are covered by the top electrode. This arrangement results in a homogeneous field across the individual pixels and continuity in the layers deposited after the photoresist layer.

A particularly convenient class of material to use for the smoothing layer is photosensitive resins. Such resins have several advantages. They can be used in spin coating and therefore provide a conformal coating smoothing out all edges. They can be directly patterned by lithography (exposure and development) without pattern transfer, thereby providing a simple process. They reflow during a hard-bake, which in this case stabilizes the photoresist and provides a smooth pixel edge. They are of a similar nature to the active materials of the OLEDs and therefore will be protected by any passivation layers that are applied to ensure the integrity of the OLEDs.

The invention thus relates to a technique which can use commercially available photoresist as a masking/smoothing layer to define the emissive and non-emissive areas of the light emitting devices. Typical thickness of this layer is in the 0.2–2 micrometer range, that is thick enough to cover all the steps produced after ITO etching. During the baking process, the photoresist reflows, providing a tapered slope at the edge. This photoresist layer therefore not only functions as a mask layer to define an active area but also blunts the steep edges produced by ITO patterning and provides tapered edges to maintain continuity in the cathode layer so that the device can be connected to the outside world. Subsequently, organic layers and a metal cathode are applied to complete the process. In this way, short circuits and discontinuities in cathode can be substantially avoided.

The invention also provides an organic light emitting device comprising a structure with stepped edges; a patterned conformal smoothing layer extending over said structure and exposing portions of said structure underlying said smoothing layer defining active regions of said device, said smoothing layer having a thickness greater than said structure and tapering over said stepped edges of said structure on said exposed portions; and additional organic and metal layers over said smoothing layer and said exposed portions of said structure.

BRIEF DESCRIPTION OF DRAWINGS

The invention will now be described in more detail, by way of example only, with reference to the accompanying drawings, in which.

DETAILED DESCRIPTION OF PREFERRED EMBODIMENTS OF INVENTION

Figure 1:
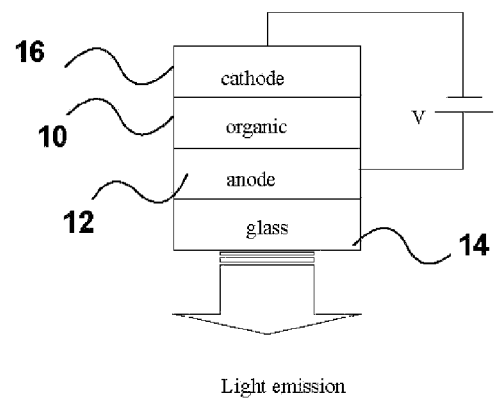
FIG. 1 is a schematic illustration of a typical OLED.
Figure 2:
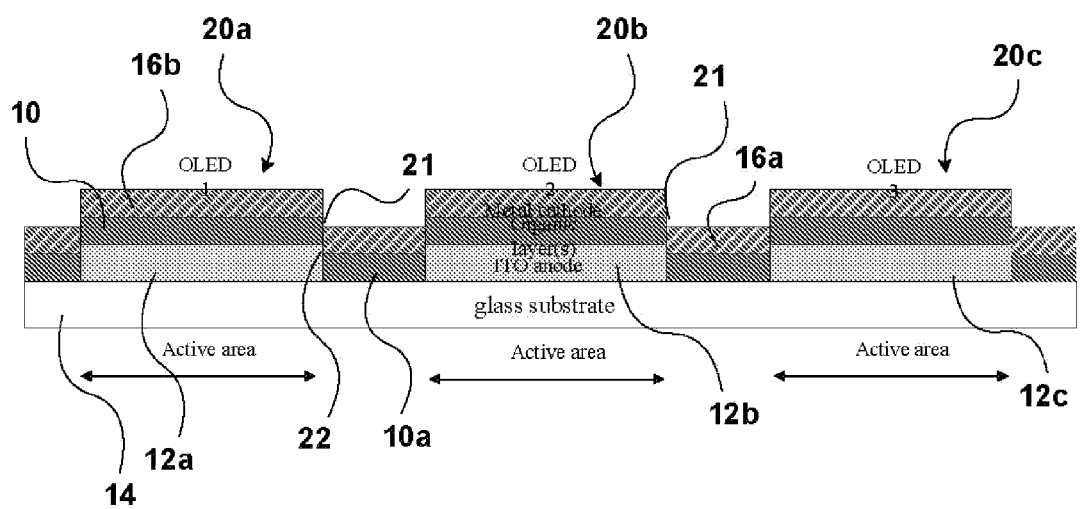
FIG. 2 is a schematic illustration of a plurality of OLEDs and possible defects encountered in such devices.
Figure 3:
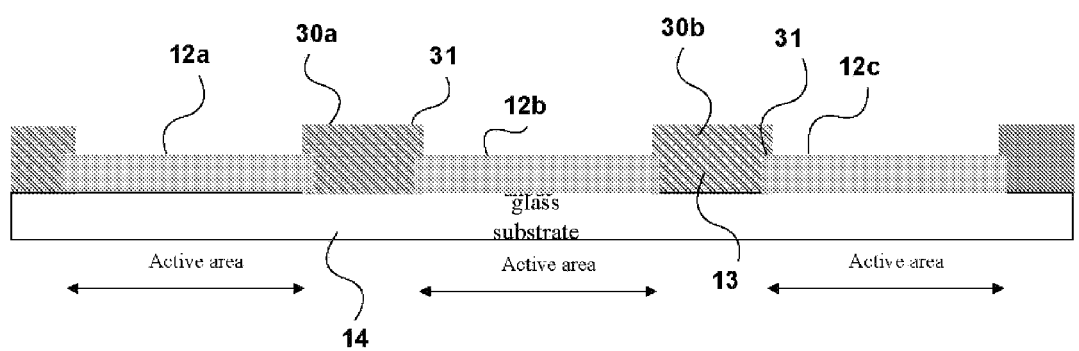
FIGS. 3 and 4 illustrate process steps in accordance with one embodiment of the invention.

A method of making an OLED in accordance with one embodiment of the invention will now be described with reference FIGS. 3 and 4. An ITO coated glass substrate 14 is cleaned in a conventional manner. The ITO layer 12 is then patterned and etched to produce individual anodes 12a, 12b, 12c. It will be appreciated that other suitable transparent materials can be employed for the substrate.

A layer of commercial photoresist 30 approximately 0.2~2 μm thick is applied between the individual anodes. This layer is exposed and developed to leave the individual columns 30a, 30b of photoresist protruding between the individual anodes and overhanging slightly over the step edges 31 of the anodes 12.

Figure 4:
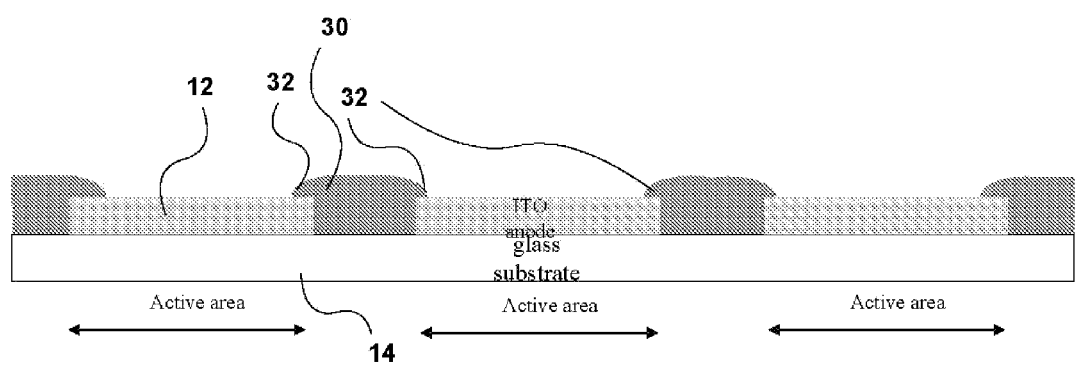

The wafer is then subjected to a baking step in which the photoresist reflows to produce columns with tapered edges 32 overhanging the exposed portions of the individual anodes as shown in FIG. 4.

Figure 5:
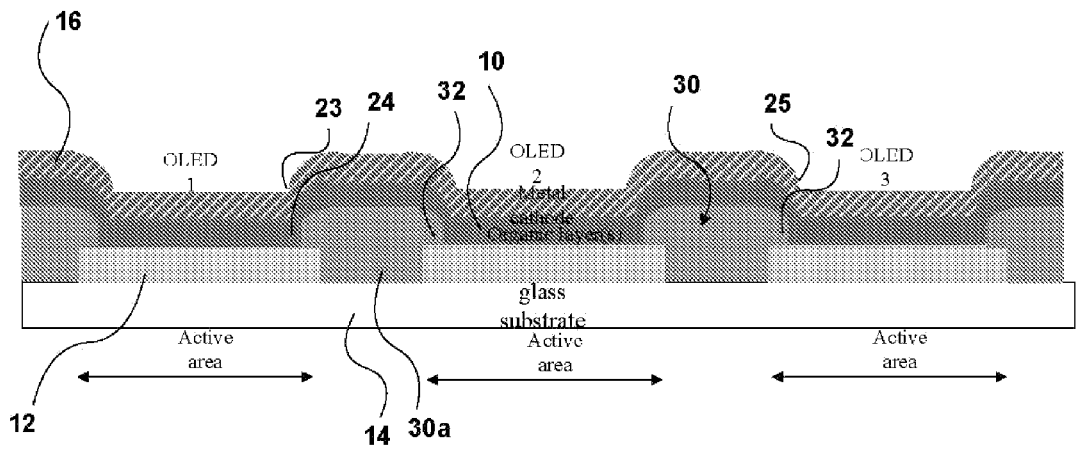
FIG. 5 shows a plurality of OLEDs on a wafer made according to one embodiment of the invention.

The photoresist layer acts as a mask for the subsequent deposition by thermal evaporation of the organic layer 10 and the metal cathode layer 16. As will be seen in FIG. 5, these two layers 10, 16 smoothly follow the contour of the photoresist layer 30 and as result steps, which might cause short-circuits, and sharp discontinuities are avoided. No short circuits are formed in the regions 23, 24, and no discontinuity is present in region 25.

In this example Shipley 1813 or 1805 photoresist is used as the masking/smoothing layer. The photoresist is spun onto the patterned ITO substrates (@5000 rpm for 30"), and then the sample is baked at 110° C. for 6 minutes before pattern exposure. The resulting photoresist layer is about 500 nm for Shipley 1805 and about 1300 nm for Shipley 1813. The exposure is for 5" at 12.5 mW/cm². The sample is then developed in Shipley 321 developer for 50" with agitation. A final hard bake is performed at 135° C. for 5 minutes. This causes the photoresist to reflow and form the slope or tapered region.

Figure 6:
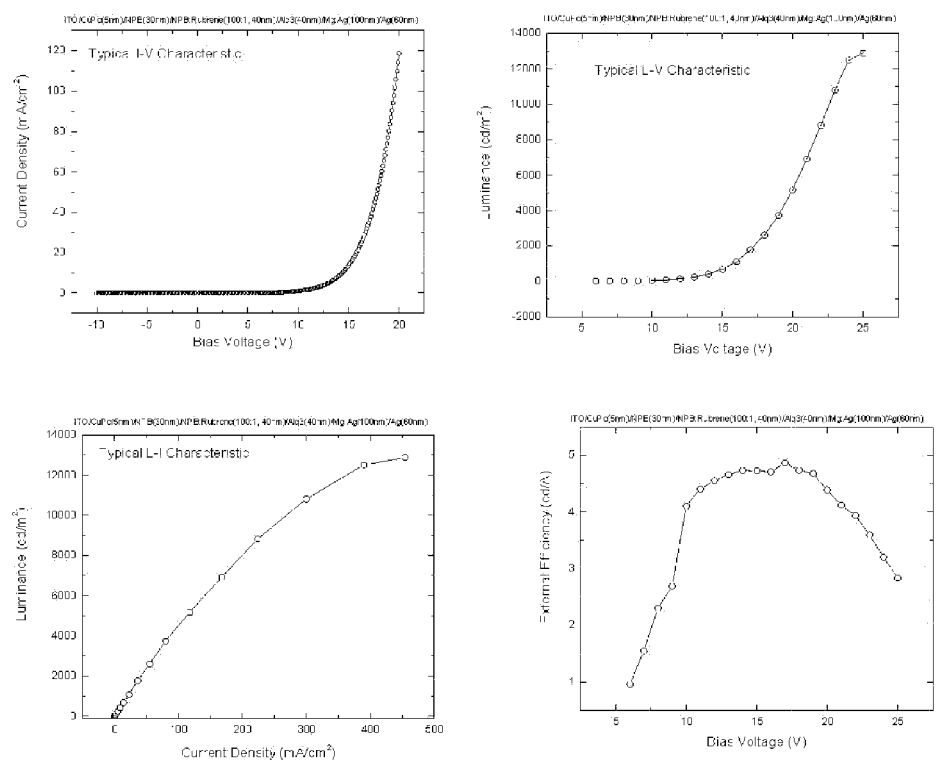
FIG. 6 is a set of graphs showing the characteristics of OLEDs made according to one embodiment of the invention.

FIG. 6 shows the characteristics of OLEDs made using the above process. The devices were made of a multi-layer organic stack on an ITO (120 nm) anode. The organic stack consisted of CuPc(5 nm)NPB(30 nm)/NPB:Rubrene(100:1, 40 nm) /Alq3(40 nm). The chemical structure of the compounds is as follows:

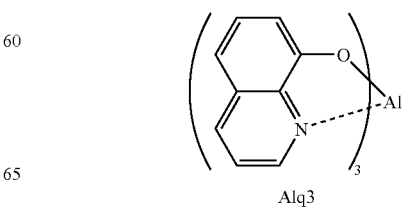

Alq3

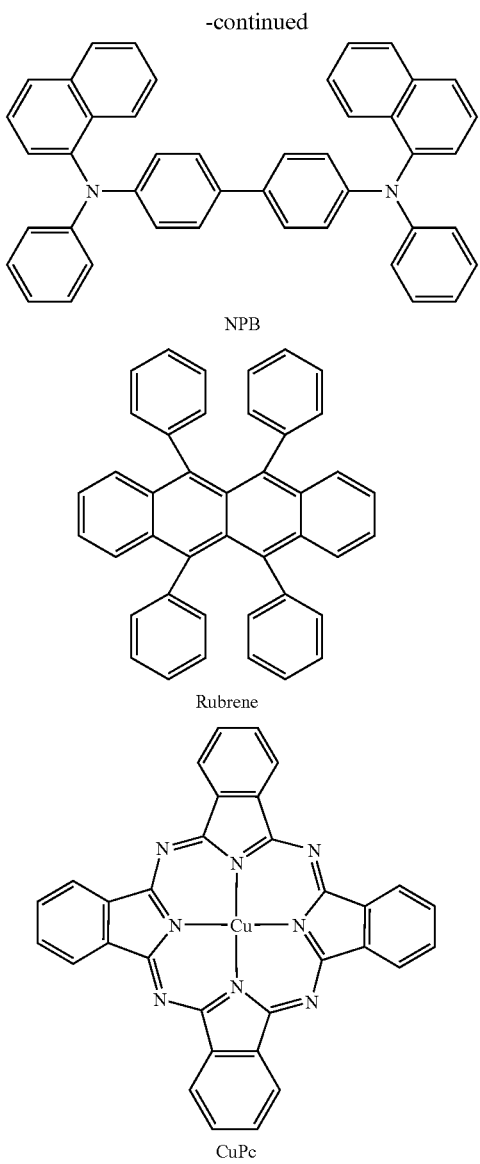

The metal cathode 16 consisted of a layer of Ag(60 nm) and a layer of an Mg:Ag alloy (10:1, 100 nm).

As can be seen in the graphs shown in FIG. 6, these devices show very good characteristics with respect to current-voltage and luminance properties compared to devices made without the smoothing layer. The photoresist smoothing layer blunts all underlying layer edges and provides sloped edge wherever a step occurs from one layer to another. This process ensures the thickness of the organic layers as constant as possible everywhere they are covered by the top electrode, thus the use of a smoothing layer results in a homogeneous field across the pixel.

The use of a photoresist as mask/smoothing layer has proved to ensure the field homogeneity and good step-coverage in OLEDs. The photoresist layer behaves like a good insulating layer.

This described method uses a simple lithographic process, avoiding complicated PECVD (plasma enhanced chemical vapor deposition) or other deposition process for insulating layer, avoiding an etching process for producing sloped edges. One simple photolithographic step produces insulting layer, pixel areas and tapered edges.

The organic light emitting devices in accordance with the invention have emissive areas and non-emissive areas, the emissive areas defining a plurality of pixels. The photoresist layer covers the non-emissive areas. The thickness of the layer is larger than the thickness of the electrode of each pixel onto which the photoresist is applied The invention is further directed to an organic light emitting device having emissive areas and non-emissive areas, the emissive areas defining a plurality of pixels. The device comprises a patterned first electrode defining the emissive areas, a photoresist layer covering non-emissive areas, the thickness of the layer being larger than the first electrode and edges of the photoresist layer being tapered by reflow. The device further comprises one or more organic layers deposited on the first electrode and the photoresist layer, and a second electrode on the organic layer.

The OLED can be formed into multipixel displays and the like using conventional technology. The method has been tested in more than three hundred batches, and proved to be reliable and reproducible.

I claim:

1. An organic light emitting device comprising:
    a structure with stepped edges;
    a patterned conformal smoothing layer extending over said structure and exposing portions of said structure underlying said smoothing layer defining active regions of said device, said smoothing layer having a thickness greater than said structure and tapering over said stepped edges on said exposed portions; and
    additional layers over said smoothing layer and said exposed portions of said structure.

2. The organic light emitting device of claim 1, wherein said smoothing layer is a photoresist layer.

3. The organic light emitting device of claim 1, wherein said structure is an anode.

4. The organic light emitting device of claim 1, wherein said additional layers comprise a single layer organic light emitting structure and a cathode.

5. The organic light emitting device of claim 1, wherein said additional layers comprise a multi-layer organic light emitting structure and a cathode.

6. The organic light emitting device of claim 1, wherein said anode is an indium tin oxide anode deposited on a transparent substrate.

7. The organic light emitting device of claim 6, wherein said transparent substrate is glass.

8. The organic light emitting device of claim 1, wherein said additional layers include a cathode made of a layer of silver and a layer of silver magnesium alloy.

9. The organic light emitting device of claim 5, wherein said multi-layer organic light emitting structure comprises an Alq3 /NPB:Rubrene (100:1)/NPB/CuPc stack.

* * * * *